(12) United States Patent
Dungan et al.

(10) Patent No.: US 8,502,272 B2
(45) Date of Patent: Aug. 6, 2013

(54) METAL-OXIDE-SEMICONDUCTOR HIGH ELECTRON MOBILITY TRANSISTORS AND METHODS OF FABRICATION

(75) Inventors: Thomas Edward Dungan, Fort Collins, CO (US); Philip Gene Nikkel, Loveland, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1152 days.

(21) Appl. No.: 11/749,459

(22) Filed: May 16, 2007

(65) Prior Publication Data
US 2008/0286915 A1  Nov. 20, 2008

(51) Int. Cl.
*H01L 29/66*  (2006.01)
(52) U.S. Cl.
USPC .................... 257/192; 257/E29.242; 257/194

(58) Field of Classification Search
USPC ............... 257/187–195, 20, 24, 27, E29.241, 257/E29.246–E29.253
See application file for complete search history.

(56) References Cited

U.S. PATENT DOCUMENTS

| | | | | |
|---|---|---|---|---|
| 4,923,827 A * | 5/1990 | Calviello et al. | ............. | 438/574 |
| 5,300,813 A * | 4/1994 | Joshi et al. | .................... | 257/752 |
| 5,389,574 A * | 2/1995 | Mizunuma | .................... | 438/167 |
| 5,861,327 A * | 1/1999 | Maeng et al. | ................. | 438/167 |
| 6,146,931 A * | 11/2000 | Nunokawa et al. | ........... | 438/172 |
| 6,410,418 B1 * | 6/2002 | Yang | ............................. | 438/626 |
| 6,521,961 B1 * | 2/2003 | Costa et al. | ................... | 257/402 |
| 7,847,410 B2 * | 12/2010 | Lee et al. | ...................... | 257/776 |
| 2003/0213975 A1 * | 11/2003 | Hirose et al. | ................. | 257/194 |
| 2004/0056366 A1 * | 3/2004 | Maiz et al. | .................... | 257/779 |
| 2005/0139868 A1 * | 6/2005 | Anda | ............................. | 257/213 |
| 2008/0258176 A1 * | 10/2008 | Chou et al. | .................... | 257/192 |

* cited by examiner

*Primary Examiner* — Matthew W Such
*Assistant Examiner* — Ali Naraghi

(57) ABSTRACT

A method of fabricating Group III-V semiconductor metal oxide semiconductor (MOS) and III-V MOS devices are described.

4 Claims, 4 Drawing Sheets

METAL-OXIDE-SEMICONDUCTOR HIGH ELECTRON MOBILITY TRANSISTORS AND METHODS OF FABRICATION

BACKGROUND

Gallium arsenide (GaAs) and other III-V alloys have exhibited great potential for high power and/or high frequency electronic applications. Particularly desirable applications include high electron mobility transistors (HEMTs), which are electronic devices having three terminals including a gate, a drain, and a source. The HEMT is a variant of GaAs field effect transistor (FET) technology that offers substantially better performance than standard metal-semiconductor field-effect transistor (MESFET) devices.

A HEMT includes an undoped semiconductor (e.g., GaAs or an alloy thereof) channel with a thin doped layer of semiconductor (e.g., AlGaAs) between the channel and metal gate. The doped layer furnishes the carriers for the channel. Among other benefits, the electron mobility in the channel is higher in the HEMT than in a MESFET, because there are substantially no dopant ions in the channel to scatter carriers. This results in a two-dimensional electron gas (2DEG, also referred to as the channel charge), which is formed along the heterointerface. Among other applications, GaAs based HEMTs have become the standard for signal amplification in civil and military radar, handset cellular, and satellite communications. GaAs has a higher electron mobility and a lower source resistance than Si, which allows GaAs based devices to function at higher frequencies.

In many known HEMT devices, the gate forms a Schottky barrier with the semiconductor. Increasing the forward bias on the device increases the gate current, which in turn limits the voltage range of the device. In particular, increased gate current leads to a non-linear output and deleterious effects such as spurious frequencies. As will be appreciated, in many applications of HEMT devices, such as in communication devices, non-linear effects are undesirable.

In an effort to reduce the gate current, application of an oxide layer between the gate metal and the semiconductor has been considered. While useful to this end, many known oxide deposition techniques are above accepted temperature tolerances in III-V semiconductor processing. For example, photoresists and device features such as alloyed contacts and organic spin-on dielectrics, are unable to withstand the temperatures required to provide many known oxides. This leads to certain shortcomings and undesired results. Among other deleterious effects, in fabricating double-recess HEMT devices by such a known method, the need to apply remove a first resist and apply a second resist to form the recess for the gate can result in misalignment of the gate over the channel.

What is needed, therefore, is a method of fabricating III-V MOS devices that overcomes at least the shortcomings described.

SUMMARY

In accordance with an illustrative embodiment, a method of fabricating a semiconductor device includes forming a first gate mask; etching a recess in at least one semiconductor layer; atomic layer depositing an oxide layer; forming a second gate mask over the oxide layer; and plating a gate over the oxide layer.

In accordance with another illustrative embodiment, a metal oxide semiconductor (MOS) transistor includes a Group III-V semiconductor substrate. The transistor also includes an oxide layer disposed over a channel and a plated gate disposed over the oxide layer. In addition, the transistor includes a seed layer disposed between the plated gate and the oxide layer.

BRIEF DESCRIPTION OF THE DRAWINGS

Representative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DEFINED TERMINOLOGY

The terms 'a' or 'an', as used herein are defined as one or more than one.

The term 'plurality' as used herein is defined as two or more than two.

DETAILED DESCRIPTION

In the following detailed description, for purposes of explanation and not limitation, specific details are set forth in order to provide a thorough understanding of example embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of apparati, devices, materials and methods known to one of ordinary skill in the art may be omitted so as to not obscure the description of the example embodiments. Such apparati, devices, methods and materials are clearly within the scope of the present teachings. Furthermore, although described with respect to a MOS HEMT device, the present teachings may be applied to other devices and structures. Generally, the present teachings may be applied to group III-V semiconductor devices and their fabrication.

FIGS. 1A-1D are simplified cross-sectional views of a sequence of fabricating a semiconductor device in accordance with representative embodiment. At the outset, it is emphasized that many of the materials and methods of fabrication of certain components of the resultant device are known to those skilled in the art. For example, illustrative methods and materials are described in: U.S. Patent Publication 20060102931 to Kopley, et al.; and Formation and Characterization of Nanometer Scale Metal-Oxide-Semiconductor Structures on GaAs Using Low-Temperature Atomic Layer Deposition, by P. D. Ye, et al. (Applied Physics Letters 87 013501-1,2,3 (2005)). The disclosure of this publication and paper are specifically incorporated herein by reference.

Figure 1A:
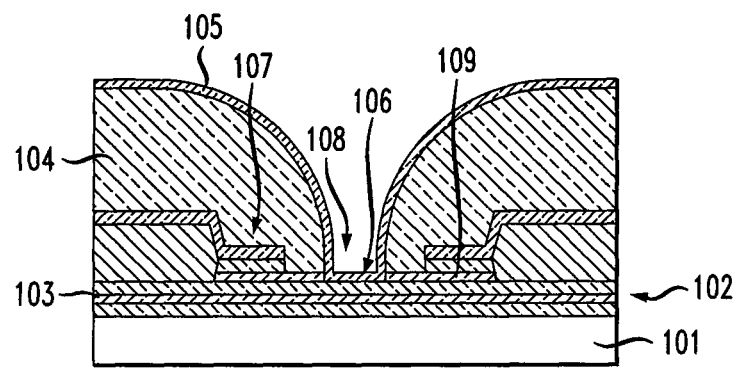
FIGS. 1A-1D are simplified cross-sectional views of a sequence for fabricating a semiconductor device in accordance with representative embodiment.

FIG. 1A shows a partially fabricated MOS HEMT device. The device includes a substrate 101 and a multiple epilayer stack 102, which includes a buried channel layer 103. The layers of the multiple epilayer stack 102 may be grown using known growth methodologies; for example, metalorganic vapor phase epitaxy (MOVPE), also known as metalorganic chemical vapor deposition (MOCVD) and organometallic chemical vapor deposition (OMCVD), organometallic vapor phase epitaxy (OMVPE) and molecular beam epitaxy (MBE). Other growth methodologies are also possible.

In steps not shown, a channel mask is formed (e.g., by patterned photoresist), and a recess 107 (often referred to as the first recess) is formed by a known etching sequence using the channel mask. Upon removal of the channel mask, and as shown in FIG. 1A, a first gate mask 104 (commonly referred to as the gate 1 mask) is disposed over the source and drain components including ohmic contacts thereof. The first gate mask 104 allows for etching of a recess 108 (often referred to as the second recess) in layer 109, which is illustratively an undoped GaAs layer disposed over the buried channel layer 103. Notably, the second recess etch may provide the recess 108 through additional layers of the multiple epilayer stack 102.

An oxide layer 105 is formed over the first gate mask 104, and over the recess 108 as shown. The oxide layer disposed over the recess 108 provides a gate oxide 106 for the MOS HEMT. As described more fully in conjunction with the representative embodiments of FIG. 3, the oxide layer 105 is illustratively an aluminum oxide (e.g., $Al_2O_3$), which is deposited by a low-temperature (LT) atomic layer deposition (ALD) method. An representative method is described in the referenced paper to Ye, et al.

Figure 1B:
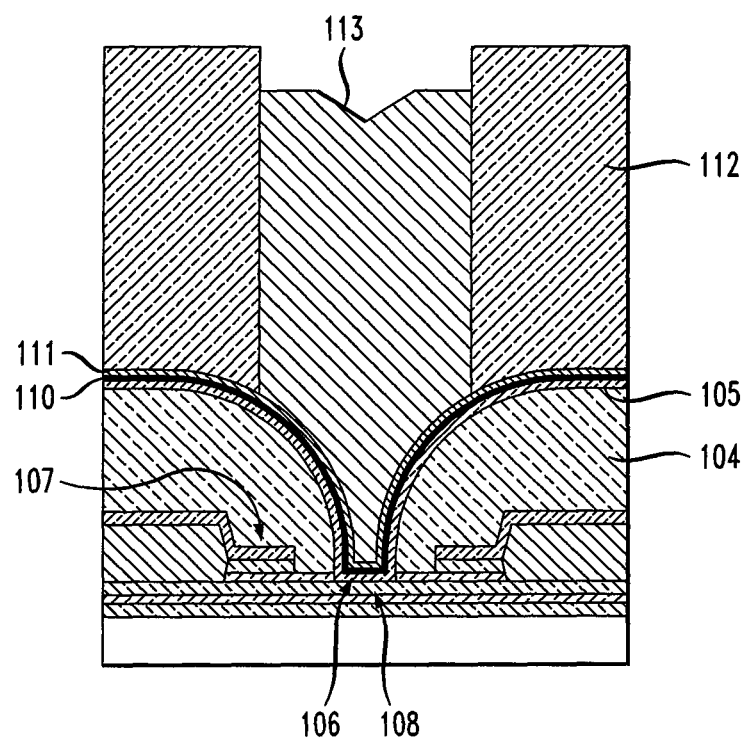

FIG. 1B shows the partially fabricated MOS HEMT after further processing. After depositing the oxide layer 105, a barrier layer 110 is formed over the oxide layer 105 and gate oxide 106. The barrier layer 110 is illustratively a refractory metal/refractory metal alloy useful in preventing migration of gate metal (e.g., Au) plated thereover in a subsequent step into the underlying semiconductor. In a representative embodiment, the barrier layer 110 is Ti/TiW/TiWN/Ti, although other materials useful in preventing migration of metal/conductive material to the underlying semiconductor may be used. After the barrier layer 110 is deposited, a seed layer 111 is deposited over the barrier layer 110. The fabrication sequence is illustratively carried out in wafer-scale fabrication. As such, the seed layer 111 is provided over the entire wafer to foster electrochemical plating over the wafer as described herein.

After the seed layer 111 is formed, a second gate mask 112 (commonly referred to as the gate 2 mask) is formed over the wafer, with openings above the first gate mask 104 and recess 108 to allow for the forming of the gate in a self-aligned manner. After the second gate mask 112 is formed, a gate 113 is formed by a known electrochemical plating sequence, with the seed layer 111 functioning as a seed for the electrochemical plating over the wafer. In representative embodiments, the gate 113 is gold; but may be another material(s) useful as a gate material and amenable to electrochemical plating.

As will be appreciated by one of ordinary skill in the art, the fabrication of the gate 113 by electrochemical plating is beneficial compared to other methods of fabricating the gate, such as by known lift-off techniques. For example, plated gates provide an improved gate cross section and thus more metal for lower gate resistance. In addition the processes of fabrication by electrochemical plating are often more readily adapted to large-scale manufacture; and may provide a gate with a comparably improved defect density. Thus, compared to known lift-off methods, there are many benefits to electrochemical plating of the representative embodiments, both in manufacturing and in the resultant product.

Figure 1C:
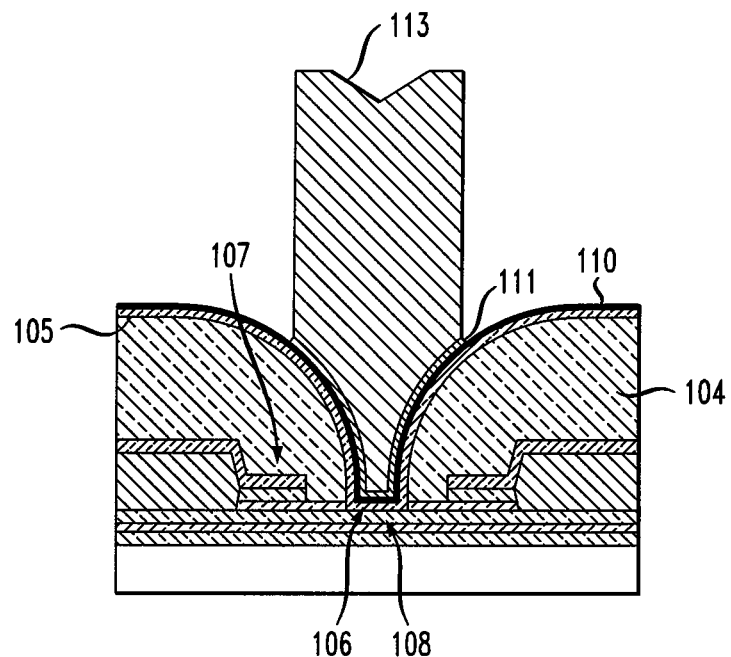

FIG. 1C shows the partially fabricated MOS HEMT after further processing. Notably, after the forming of the gate 113, the second gate mask 112 is removed by standard technique. Next, the seed layer 111, the barrier layer 110 and the oxide layer 105 must be removed all locations excepting beneath the gate 113. As such, the seed layer 111 and the barrier layer 110 are removed from the first gate mask 104.

Figure 1D:
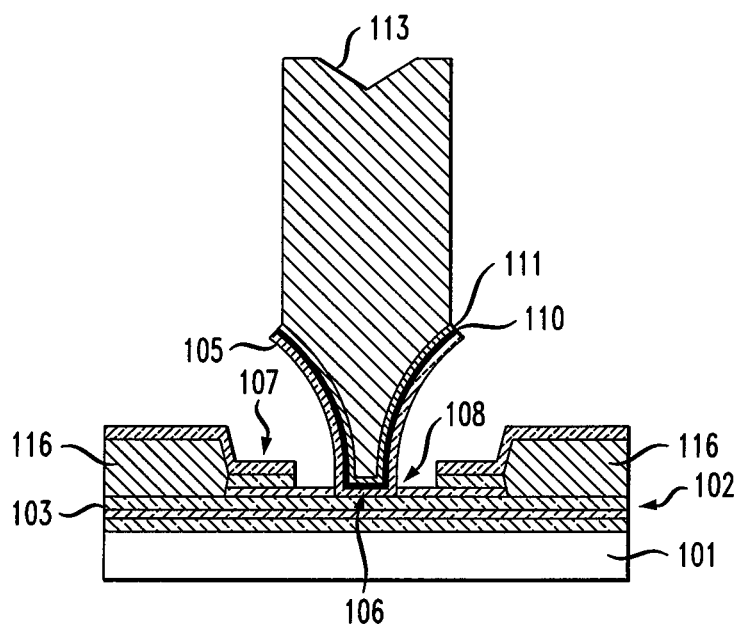

FIG. 1D shows MOS HEMT essentially after final processing. After the removal of the seed layer 111, the barrier layer 110 and the oxide layer 105 from all locations except beneath the gate 113, the first gate mask 104 is removed. The removal of the first gate mask 104 reveals the first recess 107 and ohmic contacts 116 over the drain and source, and a nitride layer 115 thereover. As such, the gate 113 formed in a self-aligned manner over the recess 108. Moreover, removal of the first gate mask 104 shows the (first) recess 107, which is also aligned to the recess 108 and thus the gate 113. Beneficially, in accordance with representative embodiments, a MOS HEMT structure is fabricated by a patterned plating technique and at comparatively low temperature processing. As will be appreciated by one of ordinary skill in the art, the resultant device usefully overcomes many of the shortcomings of other known devices; and its method of manufacture provides a substantially self-aligned gate structure device with insignificant modification to existing large-scale processing.

Figure 2:
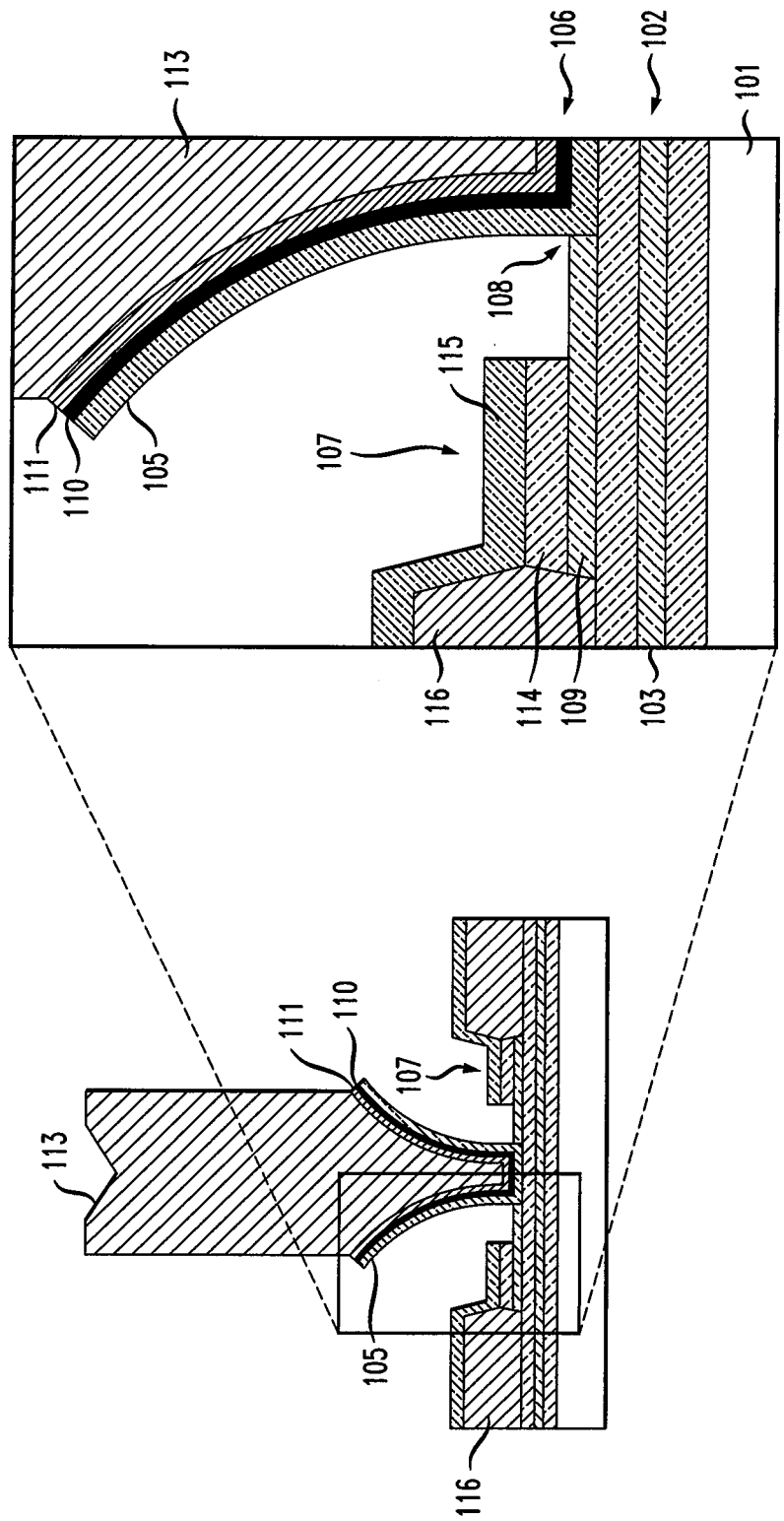
FIG. 2 is a cross-sectional view of a semiconductor device including an enlarged portion of the device in accordance with a representative embodiment.

FIG. 2 is a cross-sectional view of a semiconductor device including an enlarged portion of the device in accordance with a representative embodiment. The device is substantially identical to the resultant device shown in FIG. 1D. As such, many details of the device are not repeated.

The device includes substrate 101, and the multiple epilayer stack 102 disposed thereover. Illustratively, the multiple epilayer stack 102 comprises a first layer of AlGaAs, a second layer of AlGaAs and an undoped layer of InGaAs, which forms the buried channel layer 103. It is emphasized that the materials of the representative embodiments may be others within the purview of one of ordinary skill in the art and may have a stoichiometry that is selected based on desired device characteristics among other considerations.

The undoped layer 109, which includes the recess 108, is illustratively undoped GaAs. The gate oxide 106 is formed over the recess 108, with the portions of the barrier layer 110 and seed layer 111 formed over the gate oxide 106. At the source and drain, an ohmic cap layer 114 is provided. This layer is usefully heavily doped and may be $n^+$-doped GaAs.

Figure 3:
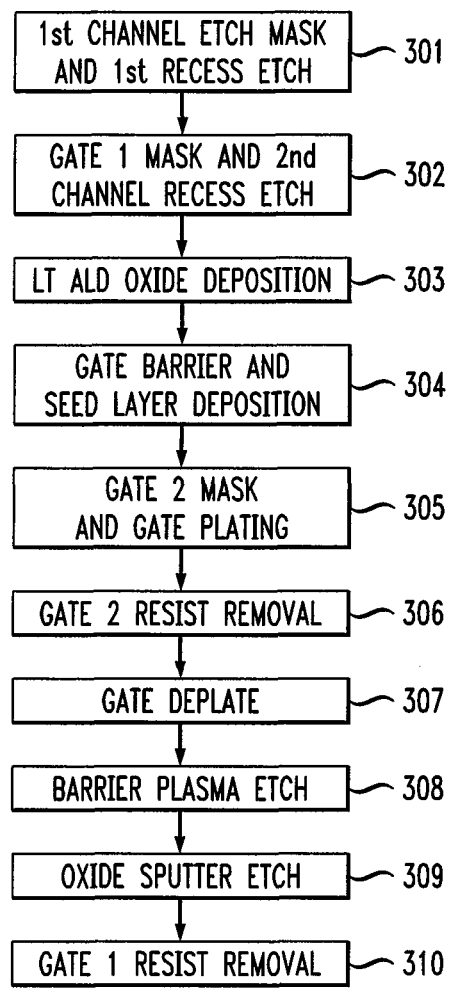
FIG. 3 is a flow diagram of a method of fabricating a semiconductor device in accordance with representative embodiment.

FIG. 3 is a flow diagram of a method of fabricating a semiconductor device in accordance with representative embodiment. The illustrative method includes many of the features and methods described in connection with representative embodiments described previously. As such, many details of the device are not repeated.

As noted previously, MOS HEMT devices of representative embodiments are illustratively double recess devices. At step 301, the method includes forming a first channel etch mask and a first channel recess etch. In this step, a channel etch mask is formed, such as by patterned photoresist. Etching is carried out by known methods to provide a recess in the upper layer(s) of the multiple epilayer stack 102, such as the ohmic cap layer 114.

At step 302, the first gate mask 104 is formed, such as by patterned photoresist. This mask is open over the undoped layer 109, allowing for etching of this layer and other layers of the multiple epilayer stack 102 over the buried channel layer 103 as desired.

At step 303, the LT ALD sequence is effected. In representative embodiments, the deposition is effected at temperatures of less than 300° C.; and is beneficially effected at temperatures of in they range of approximately 25° C. to approximately 150° C. In certain embodiments, the deposition is effected at temperatures less than approximately 100° C. This LT ALD deposition thickness may range from approximately 20 Angstoms to approximately 300 Angstroms.

At step 304, the barrier layer 110 (also referred to as the gate barrier) and seed layer 111 are formed in sequence via known methods. Illustratively, the barrier layer 110 and seed layer 111 are sputter deposited by known methods to a combined thickness of approximately 1000 Angstroms.

At step 305, the second gate mask 112 is formed. In a representative embodiments, the second gate mask 112 is formed by patterned photoresist. After the second gate mask 112 is patterned, the electrochemical plating sequence is carried out to form gates 113 over the wafer and for each HEMT device thereon. As noted previously, the incorporation of electroplating in the fabrication sequence of illustrative embodiments provides significant benefits compared to other methods to form the gate, such as by lift-off methods.

At step 306, the second gate mask 112 is removed. In embodiments including a patterned resist for the second gate mask 112, a flood expose/develop sequence is effected and the resist is removed. Alternatively, the second gate mask 112 may be removed through the use of solvent dissolution or through oxygen plasma cleaning.

At step 307, the seed layer 111 is removed from above the first gate mask 104 by a reverse electrochemical plating sequence (also referred to as deplating). This deplating sequence removes the seed layer 111 across the wafer. Notably, the seed layer remains beneath the gate 113 as shown, for example, in FIG. 1C. Alternatively, the seed layer 111 may be removed using a known chemical etch such as potassium iodide-iodine; or may be removed through ion bombardment using sputter etching or ion milling.

At step 308, the barrier layer 110 is removed from above the first gate mask by a known plasma etching sequence. Again, as shown for example in FIG. 1C, the barrier layer 110 remains beneath the gate 113. Next, at step 309, oxide layer 105 is removed from the first gate mask 104. The removal of the oxide layer 105 may be effected using a sputter etch, or other known plasma etch sequence. Notably, the oxide layer 105, 106 remains beneath the gate 113 as shown in FIGS. 1D and 2 for example.

At step 310, the first gate mask 104 is removed. As in the removal of the second gate mask 112, the first gate mask is removed by known methods. Notably, during steps 308, 309 and 310, the gate 113 functions also as a mask, preventing damage to the underlying device. At the termination of step 310, the resultant device is as shown in FIGS. 1D and 2.

In connection with illustrative embodiments, MOS HEMT devices and methods of manufacture are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A metal oxide semiconductor (MOS) transistor, comprising:
    a Group III-V semiconductor substrate;
    a first recess;
    an oxide layer disposed in the first recess and over a channel;
    a plated gate disposed over the oxide layer and in a second recess;
    a seed layer disposed between the plated gate and the oxide layer; and
    a barrier layer disposed between the seed layer and the oxide layer, wherein said barrier layer comprises a refractory metal and a refractory metal alloy.

2. A MOS transistor as claimed in claim 1, further comprising a plurality of epitaxial layers disposed between the oxide layer and the substrate, wherein one of the layers includes the channel.

3. A MOS transistor as claimed in claim 2, wherein the channel is a buried channel and the transistor is a high electron mobility transistor (HEMT).

4. MOS transistor as claimed in claim 1, wherein the gate is aligned with the first recess.

* * * * *